United States Patent [19]
Boctor

[11] B 3,993,959
[45] Nov. 23, 1976

[54] SECOND-ORDER CANONICAL ACTIVE FILTER

[75] Inventor: Stalin A. Boctor, Agincourt, Canada

[73] Assignee: Northern Electric Company Limited, Montreal, Canada

[22] Filed: Dec. 13, 1974

[21] Appl. No.: 532,326

[44] Published under the second Trial Voluntary Protest Program on March 23, 1976 as document No. B 532,326.

[52] U.S. Cl. ............................. 328/167; 307/229; 330/109
[51] Int. Cl.² ........................................ H03B 1/00
[58] Field of Search .............. 328/168, 167; 333/76, 333/80 R, 80 T; 307/229; 330/107, 109, 20, 21

[56] References Cited
UNITED STATES PATENTS

| | | | |
|---|---|---|---|
| 3,805,178 | 4/1974 | Rollett | 328/167 |
| 3,831,103 | 8/1974 | Ruegg et al. | 328/167 |
| 3,886,469 | 5/1975 | Rollett | 328/167 |

*Primary Examiner*—Stanley D. Miller, Jr.
*Assistant Examiner*—B. P. Davis
*Attorney, Agent, or Firm*—John E. Mowle

[57] ABSTRACT

A high-pass notch filter with variable gain that may be greater than unity is realized using a differential amplifier and only two capacitors that can be equal. The transmission zero and pole frequency are completely independent of the amplifier d-c gain. Three embodiments of the filter are illustrated, thus extending the available range of the gain to cover all requirements.

6 Claims, 4 Drawing Figures

SECOND-ORDER CANONICAL ACTIVE FILTER

This invention relates to an active filter circuit and more particularly to a high-pass notch filter which may have greater than unity gain in the pass band and that is realized utilizing RC components in conjunction with a single differential amplifier.

BACKGROUND OF THE INVENTION

Resistive-capacitive (RC) active filters are of considerable interest to integrated circuit designers. An RC-active realization of a high-pass notch filter utilizing a differential amplifier and only two capacitors is described in "A Single Operational Amplifier Biquadratic Filter Section" by J. J. Friend, 1970 IEEE Int.Symp. Circuit Theory (Atlanta, Ga., Dec. 14, 1974) pp. 179-180. However, filters of this type cannot attain a gain higher than unity. The main drawback in the sensitivity of most such canonical notch realizations is that their pole frequencies depend upon the d-c amplifier gain, $A_o$.

STATEMENT OF THE INVENTION

The disadvantages of prior filters of the above-mentioned type are overcome by the present invention which, in accordance therewith, there is provided a second-order canonical active filter comprising a differential amplifier, and separate impedances connected between each of the input terminals of the differential amplifier and each of the input, output and common terminals of the filter. Additionally, both of the impedances connected to one of the filter terminals are resistive-capacitive while the other impedances connected to the other two filter terminals are resistive only. The impedances in turn co-act with the differential amplifier to provide a high-pass notch filter. Such a filter utilizes fewer resistors than the prior art filters and can employ two equal capacitors.

The invention also encompasses alternate embodiments which can provide stable operation of the high-pass notch filter. They can be utilized if the required gain is less than unity.

BRIEF DESCRIPTION OF THE DRAWINGS

Example embodiments of the invention will now be described with reference to the accompanying drawings in which.

DESCRIPTION OF THE PREFERRED EMBODIMENTS

Figure 1:
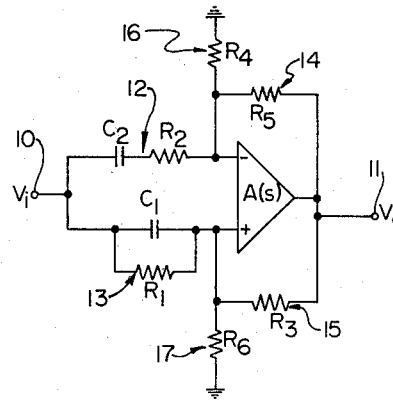
FIG. 1 is a schematic circuit diagram of one embodiment of a second-order canonical RC-active high-pass notch filter which provides a gain greater than or equal to unity.

In the embodiment illustrated in the accompanying drawings, the components are designated by reference characters, the relative values of which will be such as to satisfy the equations found in the following detailed description.

Filter Realization

The second-order high-pass notch filter to be realized has the voltage transfer function $$T(s) = G \frac{s^2 + \omega_z^2}{s^2 + \frac{\omega_o}{Q_o}s + \omega_o^2} \qquad (1)$$

where $G \geq 1$ and $w_z < w_o$.

Figure 2:
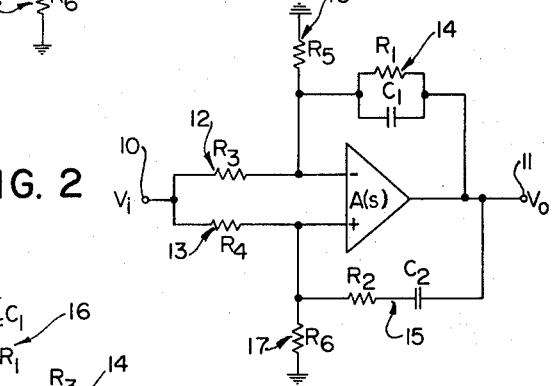
FIG. 2 is a schematic circuit diagram of a second embodiment of the second-order canonical RC-active high-pass notch filter which provides a gain less than unity.
Figure 3:
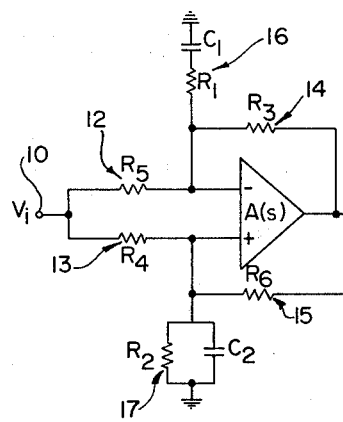
FIG. 3 is a schematic circuit diagram of a third embodiment of the second-order canonical RC-active high-pass notch filter which provides any required gain.

The second-order canonical active filters illustrated in FIGS. 1, 2 and 3 each comprise an input terminal 10 for connecting an input voltage $V_i$ thereto and an output terminal 11 for connecting an output voltage $V_o$ therefrom. In addition, each include a single operational amplifier $A(s)$ having a differential input, and an output which is connected to the output terminal 11. Also, each of the filters includes a first set of impedance arms 12 and 13 connected between the input terminal 10 and the inverting and non-inverting inputs respectively of the operational amplifier $A(s)$; a second set of impedance arms 14 and 15 connected between the output terminal 11 and the inverting and non-inverting inputs respectively of the amplifier $A(s)$; and a third set of impedance arms 16 and 17 connected between the inverting and non-inverting inputs and the common or ground terminal.

Two of the sets of impedance arms contain resistances $R_3$, $R_4$, $R_5$ and $R_6$ only, while the remaining set includes a series RC network of resistance $R_1$ and capacitance $C_1$ and a shunt RC network of resistance $R_2$ and capacitance $C_2$. In each of the embodiments, the RC networks are contained in a different set of arms of the filter. However, all three embodiments are such as to satisfy the overall transfer function of the network which is given by equation (1).

FIRST EMBODIMENT

In the first embodiment, the RC networks are connected in the two input arms 12 and 13 as shown in FIG. 1. The voltage transfer function of this network is given by:

$$T(s) = \left[\frac{s + \frac{1}{R_1C_1}}{s + \frac{1}{R_{eq_1}C_1}} - k_2 \frac{s}{s + \frac{1}{R_{eq_2}C_2}}\right] \bigg/ \left[\frac{1}{A(s)} + k_1 \frac{s + \frac{1}{R_2C_2}}{s + \frac{1}{R_{eq_2}C_2}} - \frac{1}{R_3C_1} \frac{1}{s + \frac{1}{R_{eq_1}C_1}}\right]$$

$$= \frac{s^2(1 - k_2) + s\left(\frac{1}{R_1C_1} + \frac{1}{R_{eq_2}C_2} - \frac{k_2}{R_{eq_1}C_1}\right) + \frac{1}{R_1 R_{eq_2} C_1 C_2}}{s^2\left(\frac{1}{A(s)} + k_1\right) + s\left[\frac{1}{A(s)}\left(\frac{1}{R_{eq_1}C_1} + \frac{1}{R_{eq_2}C_2}\right) + k_1\left(\frac{1}{R_2C_2} + \frac{1}{R_{eq_1}C_1}\right) - \frac{1}{R_3C_1}\right] + \frac{1}{R_{eq_1}R_{eq_2}C_1C_2}\left[\frac{1}{A(s)} + k_1\left(\frac{R_{eq_2}}{R_2} - \frac{R_{eq_4}}{k_1R_3}\right)\right]} \qquad (2)$$

where:

$$\frac{1}{R_{eq_1}} = \frac{1}{R_1} + \frac{1}{R_3} + \frac{1}{R_6} \tag{2a}$$

$$R_{eq_2} = R_2 + R_{45} \tag{2b}$$

$$R_{45} = \frac{R_4 R_5}{R_4 + R_5} \tag{2c}$$

$$k_1 = \frac{R_2}{R_5} k_2 \tag{2d}$$

$$k_2 = \frac{R_{45}}{R_{eq_2}} \tag{2e}$$

and $A(s)$ is the amplifier open loop gain.

The transfer function in equation (2) will give a high-pass notch response whose pole frequency is independent of the amplifier d-c gain $A_o$, under the conditions $$k_2 = \frac{R_{eq_1}}{R_1} + \frac{R_{eq_1} C_1}{R_{eq_2} C_2} \text{(notch condition)} \tag{3}$$

and $$k_1 = \frac{R_{eq_1}}{R_3} \cdot \frac{R_2}{R_{45}} \text{(pole independence condition)} \tag{4}$$

Using equations (3) and (4) and rearranging (2), the transfer function can now be written as $$T(s) = \frac{1-k_2}{\frac{1}{A(s)} + k_1} \cdot \frac{s^2 + \frac{1}{R_1 R_2 C_2 C_2}}{s^2 + \frac{s}{1 + \frac{1}{k_1 A(s)}} \left[ \frac{1}{k_1 A(s)} \left( \frac{1}{R_{eq_1} C_1} + \frac{1}{R_{eq_2} C_2} \right) + \frac{1}{R_{eq_1} C_1} \left( 1 - \frac{R_{eq_1} R_{eq_2}}{R_1 R_2} \right) \right] + \frac{1}{R_{eq_1} R_{eq_2} C_1 C_2}} \tag{5}$$

where only the coefficient of $s$ is dependent on the open loop gain $A(s)$. As $A(s)$ tends to $\infty$ in the ideal case.

$$T(s) = \frac{1-k_2}{k_1} \cdot \frac{s^2 + \frac{1}{R_1 R_2 C_1 C_2}}{s^2 + s \left[ \frac{1}{R_{eq_1} C_1} \left( 1 - \frac{R_{eq_1} R_{eq_2}}{R_1 R_2} \right) \right] + \frac{1}{R_{eq_1} R_{eq_2} C_1 C_2}} \tag{6}$$

Comparison of equations (1) and (6) gives:

$$G = \frac{1-k_2}{k_1} = \frac{R_5}{R_{45}} = 1 - \frac{R_5}{R_4} \tag{7}$$

$$\omega_z^2 = \frac{1}{R_1 R_2 C_1 C_2} \tag{8}$$

$$\omega_o^2 = \frac{1}{R_{eq_1} R_{eq_2} C_1 C_2} \tag{9}$$

and $$\frac{\omega_o}{Q_o} = \frac{1}{R_{eq_1} C_1} \left( 1 - \frac{R_{eq_1} R_{eq_2}}{R_1 R_2} \right) = \frac{1}{R_{eq_1} C_1} \left( 1 - \frac{\omega_z^2}{\omega_o^2} \right) \tag{10}$$

Equations (7)–(10) together with (3) and (4) give only six relations in the eight circuit elements. As $R_2$ can be the variable impedance level parameter, one condition can be arbitrarily chosen, for example:

$$C_1 = C_2 = C \tag{11}$$

To determine the design formulae for the elements values, let:

$$\gamma^2 = \frac{R_{eq_2} C_2}{R_{eq_1} C_1} \tag{12}$$

Hence from (9)

$$R_{eq_1} C_1 \gamma = \frac{1}{\omega_o} \tag{13}$$

and from (10)

$$\gamma^{-1} = Q_o \left( 1 - \frac{\omega_z^2}{\omega_o^2} \right) \tag{14}$$

From (7), (8), (9) and (3):

$$G \frac{\omega_z^2}{\omega_o^2} = \frac{1}{k_1} \frac{R_{eq_1}}{R_1} = \left( G + \frac{R_5}{R_2} \right) \left( \frac{1}{1 + \frac{R_2 G}{R_5}} - \frac{1}{\gamma^2} \right)$$

Solving the above equation for $$G \frac{R_2}{R_5},$$

the only possible solution is:

$$G \frac{R_2}{R_5} = \alpha = \frac{\gamma^2 - 1}{1 + \gamma^2 \frac{\omega_z^2}{\omega_o^2}} \tag{15}$$

Thus for a given impedance level $R_2$, equation (15) determines $R_5$.

Then, $$R_4 = \frac{R_5}{G-1} = \frac{R_2}{\alpha} \cdot \frac{G}{G-1} \qquad (16)$$

and $$R_{eq_2} = R_2 + R_{45} = R_2 + \frac{R_5}{G} = R_2\left(1 + \frac{1}{\alpha}\right) \qquad (17)$$

For the case of equal capacitors:

$$R_{eq_1} = \frac{R_{eq_2}}{\gamma^2} \qquad (18)$$

$$C_1 = C_2 = C = \frac{1}{\gamma \omega_o R_{eq_1}} \qquad (19)$$

Once $R_{eq_1}$ is known, then:

$$\frac{R_{eq_1}}{R_3} = k_1 \frac{R_{45}}{R_2} = \frac{k_2}{G} = \frac{R_5}{G(R_5 + GR_2)} = \frac{1}{G(1+\alpha)} \qquad (20)$$

and $$\frac{R_{eq_1}}{R_1} = k_1 G \frac{\omega_z^2}{\omega_o^2} = G \frac{\omega_z^2}{\omega_o^2} \cdot \frac{R_2}{R_5 + GR_2} = \frac{\omega_z^2}{\omega_o^2} \cdot \frac{\alpha}{1+\alpha} \qquad (21)$$

Finally:

$$\frac{R_{eq_1}}{R_6} = 1 - \left(\frac{R_{eq_1}}{R_1} + \frac{R_{eq_1}}{R_3}\right) = \frac{\left(\gamma^2 + \frac{\omega_z^2}{\omega_o^2}\right)G - \left(1 + \gamma^2 \frac{\omega_z^2}{\omega_o^2}\right)}{G\gamma^2} \qquad (22)$$

Equations (15) – (22) give the design procedure. All the elements values are positive when:

$$\gamma > 1, \text{ i.e. } Q_o < \frac{1}{1 - \frac{\omega_z^2}{\omega_o^2}} \qquad (A)$$

and $$G > \frac{1 + \gamma^2 \frac{\omega_z^2}{\omega_o^2}}{\gamma^2 + \frac{\omega_z^2}{\omega_o^2}} \qquad (B)$$

The maximum value of the right-hand side of condition (B) is unity when $\gamma = 1$. This quantity decreases as $\gamma$ increases. Hence condition (B) is always satisfied when (A) is.

Condition (A) is not a severe restriction however. For example, the maximally flat approximation for a second-order transfer function requires that:

$$\frac{\omega_z^2}{\omega_o^2} = 1 - \frac{1}{2Q_o^2}$$

TUNING PROCESS

When it is possible to trim resistors in order to compensate for errors in the two capacitors so that the network's frequency response satisfies the exact filter requirements, the tuning process can be performed by first measuring the two capacitors $C_1$ and $c_2$. Hence the six relations, equations (3), (4) and (7)–(10) can be used to determine the required values of the resistive elements. Note that equations (13)–(15) are still satisfied here.

Thus $R_{eq_1}$ can be found from (13) and $R_{eq_2}$ can be calculated from (9). As:

$$R_{eq_2} = R_2 + R_{45} = R_2\left(1 + \frac{1}{\alpha}\right),$$

then substituting from (15) in the above relation, $R_2$ can be found. Consequently, equations (15), (16) and (20)–(22) can be used to obtain the required new values for $R_5$, $R_4$, $R_3$, $R_1$ and $R_6$ respectively.

SECOND EMBODIMENT

In the second embodiment, the RC networks are connected in the two feedback arms 14 and 15, as illustrated in FIG. 2. Following a design analysis similar to that outlined above, it can be shown that this network also provides a stable operation of the high-pass notch characteristics defined in equation (1).

Here $R_{eq_1}$ and $R_{eq_2}$ are defined as:

$$R_{eq_1} = R_1 \parallel R_3 \parallel R_5$$

$$R_{eq_2} = R_2 + R_{46} = R_2 + \frac{R_4 R_6}{R_4 + R_6}$$

The design parameter $\gamma$ is still defined as in (12), satisfying (14), while the parameter $\alpha$ is defined by:

$$\alpha = \left(1 + \frac{\omega_z^2}{\omega_o^2}\right) \Big/ \left(1 - \frac{1}{\gamma^2}\right) = \frac{R_{eq_2}}{R_2}$$

The pass-band gain of this network is always less than or equal to unity as $$G = 1 \Big/ \left(1 + \frac{R_4}{R_6}\right)$$

If $R_2$ was chosen as the variable impedance level parameter and the two capacitors were to be equal, the design formulae can be summarized as follows:

$$R_4 = R_2 \cdot \frac{\alpha - 1}{G}$$

$$R_6 = R_2 \cdot \frac{\alpha - 1}{1 - G}$$

$$R_{eq_1} = \frac{\alpha}{\gamma^2} R_2$$

$$C = C_1 = C_2 = \frac{\gamma}{\alpha \omega_o R_2}$$

$$R_1 = \alpha R_{eq_1}$$

$$\frac{R_{eq_1}}{R_3} = \frac{G}{\alpha}\left(\alpha - \frac{\omega_z^2}{\omega_o^2}\right)$$

$$\frac{R_{eq_1}}{R_5} = 1 - G - \frac{1}{\alpha}\left(1 - G \frac{\omega_z^2}{\omega_o^2}\right)$$

For all the elements values to be positive, condition (A) must be satisfied, while condition (B) will be changed to:

$$G \leq \frac{1 + \gamma^2(\omega_z^2/\omega_o^2)}{\gamma^2 + (\omega_z^2/\omega_o^2)}$$

The quantity in the right-hand side has a maximum value of unity when $\gamma = 1$ and a minimum value of $$\frac{\omega_z^2}{\omega_o^2}$$

when $\gamma$ tends to $\infty$.

THIRD EMBODIMENT

In the third embodiment the two RC networks are connected in the ground branches 16 and 17 as shown in FIG. 3. This network also gives a stable high-pass notch filter whose voltage transfer characteristics are as defined in (1), but include a phase shift of 180°.

This modification is the most flexible as its pass-band gain can have any required value higher or lower than unity, since $$G = \frac{R_2}{R_5}$$

Denoting:

$$R_{eq_1} = R_1 + R_{35} = R_2 + \frac{R_3 R_5}{R_3 + R_5}$$

and $$R_{eq_2} = R_2 \, // \, R_4 \, // \, R_6$$

while the parameter $\gamma$ is $$\gamma = \left[ \frac{R_{eq_2} C_2}{R_{eq_1} C_1} \right]^{1/2} = Q_o \left( 1 - \frac{\omega_z^2}{\omega_o^2} \right)$$

and $$\alpha = \frac{1 + (\omega_z^2/\omega_o^2)}{1 - \gamma^2} = \frac{R_{eq_1}}{R_1}$$

With $R_1$ as the variable impedance level parameter and the two capacitors equal, the following design formulae can be easily obtained.

$$R_3 = R_1 (1 + G)(\alpha - 1)$$

$$R_5 = \frac{R_1}{G}(1 + G)(\alpha - 1)$$

$$C = C_1 = C_2 = \frac{1}{\alpha \gamma \omega_o R_1}$$

$$R_{eq_2} = \alpha \gamma^2 R_1$$

$$\frac{R_{eq_2}}{R_2} = \frac{1 + G(\omega_z^2/\omega_o^2)}{\alpha(1 + G)}$$

$$\frac{R_{eq_2}}{R_4} = \frac{G(1 + \gamma^2 \alpha)}{\alpha(1 + G)}$$

$$\frac{R_{eq_2}}{R_6} = \frac{\alpha - 1}{\alpha(1 + G)}$$

All the elements values will be positive, provided that only condition (A) is satisfied.

Examination of the sensitivities of the second and third embodiments discussed above, revealed that the first embodiment has the lowest active $Q_o$ sensitivity for the same filter specifications. Also, from the point of view of elements values spread, the first embodiment is better than the third embodiment, while the latter is better than the second. All three different configurations are limited to the same allowable range of pole-Q variation, fixed by condition (A).

PRACTICAL EXAMPLE

Referring again to the embodiment illustrated in FIG. 1, the required filter is a 60 Hz rejection filter with gain higher than unity, having the following specifications:

Finite high frequency gain = 4
Attenuation at 60 Hz $\geq$ 21.5 dB
Attenuation at 180 Hz $\leq$ 3.5 dB
For $f \geq$ 300 Hz, attenuation must be $\leq$ 0.3 dB.

Using a maximally flat approximation, the pole-Q, $Q_o$ was chosen to be unity so as to accommodate for the required attenuation at 60 Hz with $\pm$ 5% change. This leads to:

$$\frac{\omega_z^2}{\omega_o^2} = 1 - \frac{1}{2Q_o^2} = \frac{1}{2}$$

$$\gamma = 2$$

$$\alpha = G \frac{R_2}{R_5} = 1$$

Figure 4:
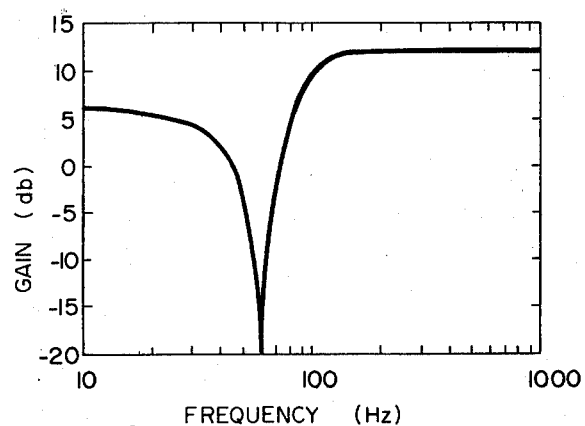
FIG. 4 is a typical response curve of gain vs frequency for the filter illustrated in the embodiment of FIG. 1.

For the equal capacitance case and choosing an impedance level $R_2 = 12.5\text{K}\Omega$ the elements values are:

$R_1 = 25\text{K}\Omega$, $R_2 = 12.5\text{K}\Omega$, $R_3 = 50\text{K}\Omega$
$R_4 = 16.667\text{K}\Omega$, $R_5 = 50\text{K}\Omega$, $R_6 = 10\text{K}\Omega$
$C_1 = C_2 = 0.15005\mu\text{F}$ A typical response of such a filter is illustrated in FIG. 4. To illustrate the effect of varying the gain, the same filter is designed with unity gain. The new elements values are:

$R_1 = 25\text{K}\Omega$, $R_2 = 12.5\text{K}\Omega$, $R_3 = 12.5\text{K}\Omega$
$R_4 = \infty$, $R_5 = 12.5\text{K}\Omega$, $R_6 = 25\text{K}\Omega$
$C_1 = C_2 = 0.15005\mu\text{F}$ The second-order canonical filters presented here can realize high-pass notch characteristics with any gain requirement. Gain higher than unity is achieved at the expense of higher passive sensitivities and $S_A Q$, although the pole frequency and the zeros are completely independent of the amplifier d-c gain. $S_A Q$ is the sensitivity of the active pole-Q ($Q_o$) with respect to the d-c amplifier gain, thus:

$$S_{A_o}^{Q_o} = \frac{\frac{\Delta Q_o}{Q_o}}{\frac{\Delta A_o}{A_o}} = \frac{A_o}{Q_o} \frac{\delta Q_o}{\delta A_o}$$

When the gain required is unity, better passive and active sensitivities are achieved as compared to previous canonical designs and only five resistors are required. Such active filters are easily tunable through a measure and trim process, as described above. The 60 Hz rejection filter designed according to the procedure outlined, satisfies all the requirements, even with ±5% capacitors variations.

What is claimed is:

1. A second-order canonical active filter comprising:
input, output and common terminals;
a differential amplifier having inverting and noninverting inputs, and an output, the output of the differential amplifier being connected to said output terminal;
a first set of impedances including first and second impedance arms connected between said inverting and noninverting inputs respectively and said input terminal;
a second set of impedances including third and fourth impedance arms connected between said inverting and noninverting inputs respectively and said common terminal;
a third set of impedances including fifth and sixth impedance arms connected between said inverting and noninverting inputs respectively and said output terminal;
each of the impedance arms of one of said sets being complex resistive-capacitive impedances and the other impedance arms of the other two sets being resistive,
said impedances coacting with said differential amplifier to provide a notch filter.

2. A second-order canonical active filter as defined in claim 1 in which:
the first arm includes a first resistor and a first capacitor connected in series;
the second arm includes a second resistor and a second capacitor connected in shunt; and
the third, fourth, fifth and sixth arms include third, fourth, fifth and sixth resistors respectively.

3. A second-order canonical active filter as defined in claim 1 in which:
the third arm includes a first resistor and a first capacitor connected in series;
the fourth arm includes a second resistor and a second capacitor connected in shunt; and
the first, second, fifth and sixth arms include third, fourth, fifth and sixth resistors respectively.

4. A second-order canonical active filter as defined in claim 1 in which:
the fifth arm includes a first resistor and a first capacitor connected in shunt;
the sixth arm includes a second resistor and a second capacitor connected in series; and
the first, second, third and fourth arms include third, fourth, fifth and sixth resistors respectively.

5. A second-order canonical active filter comprising:
input, output and common terminals;
a differential amplifier having inverting and noninverting inputs, and an output, the output of the differential amplifier being connected to said output terminal;
six separate impedances each being connected between a different one of said amplifier inputs and one of said terminals;
both of said impedances connected to one of said terminals being resistive-capacitive, and the impedances connected to the other two terminals being resistive;
the impedances coacting with the differential amplifier to provide a notch filter.

6. A second-order canonical active filter as defined in claim 5 in which one impedance connected to said one terminal is a serially connected resistor and capacitor, and the other impedance connected to said one terminal is a shunt connected resistor and capacitor.

* * * * *